(12) United States Patent 
Kim et al.

(10) Patent No.: US 9,159,754 B1
(45) Date of Patent: Oct. 13, 2015

(54) IMAGE SENSOR HAVING ANTI-REFLECTIVE LAYER AND FABRICATING METHOD THEREOF

(71) Applicants: SK hynix Inc., Gyeonggi-do (KR); INDUSTRY-ACADEMIC COOPERATION FOUNDATION YONSEI UNIVERSITY, Seoul (KR)

(72) Inventors: Do Hwan Kim, Chungcheongbuk-do (KR); Hyun Chul Sohn, Seoul (KR); Hee Do Na, Seoul (KR); Kyung Dong Yoo, Seoul (KR); Jong Chae Kim, Gyeonggi-do (KR)

(73) Assignees: SK Hynix Inc., Gyeonggi-do (KR); Industry-Academic Cooperation Foundation Yonsei University, Seoul (KR)

( * ) Notice: Subject to any disclaimer, the term of this patent is extended or adjusted under 35 U.S.C. 154(b) by 0 days.

(21) Appl. No.: 14/579,514

(22) Filed: Dec. 22, 2014

(30) Foreign Application Priority Data

Sep. 18, 2014 (KR) .................. 10-2014-0124295

(51) Int. Cl.
*H01L 29/04* (2006.01)
*H01L 29/10* (2006.01)
*H01L 31/00* (2006.01)
*H01L 27/146* (2006.01)

(52) U.S. Cl.
CPC ...... *H01L 27/1462* (2013.01); *H01L 27/14621* (2013.10); *H01L 27/14627* (2013.01); *H01L 27/14685* (2013.01)

(58) Field of Classification Search
USPC ......... 257/57, 59, 72, 83, 257, 290, 351, 368, 257/392, E29.003, E29.295, 66, E21.7, 13, 257/79–103, 918, E51.018–E51.022, 257/E33.001–E33.077, E33.054, E25.028, 257/E28.032, 88, 99, 642–643, 759, 257/E51.001–E51.052, E25.008–E25.009, 257/432, 292, 435, 431, 437, 447; 438/72, 438/29, 69, 82, 99, 28, 22–47, 493, 503, 438/507, 956, 30, 48, 128, 149, 151, 157, 438/161, 283
See application file for complete search history.

(56) References Cited

U.S. PATENT DOCUMENTS

2011/0235184 A1 9/2011 Park et al.
2012/0228473 A1* 9/2012 Yoshitsugu ................ 250/208.1

FOREIGN PATENT DOCUMENTS

JP 2011-114292 6/2011
JP 2011-159985 8/2011

* cited by examiner

*Primary Examiner* — Dao H Nguyen
*Assistant Examiner* — Tram H Nguyen
(74) *Attorney, Agent, or Firm* — IP & T Group LLP

(57) ABSTRACT

An image sensor includes a pixel layer in which an active pixel array and an optical black pixel array are formed; a first anti-reflective layer which is formed over the active pixel array, and including a hafnium oxide layer with a high transmittance; and a second anti-reflective layer which is formed over the optical black pixel array, and including a hafnium oxide layer with a low transmittance.

15 Claims, 4 Drawing Sheets

IMAGE SENSOR HAVING ANTI-REFLECTIVE LAYER AND FABRICATING METHOD THEREOF

CROSS-REFERENCES TO RELATED APPLICATION

The present application claims priority under 35 U.S.C. §119(a) to Korean application number 10-2014-0124295, filed on Sep. 18, 2014, in the Korean Intellectual Property Office, which is herein incorporated by reference in its entirety.

BACKGROUND

1. Technical Field

Various embodiments generally relate to image sensors and, more particularly, to image sensors configured by complementary metal oxide semiconductors (CMOS) and fabricating methods thereof.

2. Related Art

Image sensors sense external images as light, convert sensed light into electric signals, and transmit the electric signals to devices that process digital signals. Generally, there are two kinds of image sensors, charge-coupled device (CCD) image sensors and complementary metal oxide semiconductor (CMOS) image sensors.

CCD image sensors include photodiodes that are formed on P type impurity layers, CCDs, and signal detection circuits. The photodiodes convert light into charges. The CCDs transmit the charges to the signal detection circuit, and the signal detection circuit converts the charges into voltages and then outputs the voltages.

The CMOS type image sensor includes CMOS transistors in which a PMOS (P-channel metal oxide semiconductor) transistor and an NMOS (N-channel metal oxide semiconductor) are joined, and converts images into electric signals. Since the CMOS technology is capable of being highly integrated and operating with low power consumption, CMOS technology is often used in small-sized electronic appliances, such as mobile phones.

CMOS image sensors include active pixel arrays, which receive light, and optical black pixel arrays, which block light.

The active pixel arrays have pixels that receive light, resulting in the generation and accumulation of photo charges. The optical black pixel array blocks the introduction of unwanted light to minimize interference. As the active pixel array and the optical black pixel array have different functions, they also have different structures.

Japanese Patent Publication No. 2011-114292 discloses an active pixel array and an optical black pixel array that have different structures and are fabricated by different processes. Thus, that image sensor fabrication process is complicated and expensive. The invention disclosed herein seeks to simplify the image sensor fabrication process and improve image sensor product quality.

SUMMARY

Various embodiments are directed to an image sensor with improved black level compensation characteristics of an optical black pixel array, and a fabricating method thereof.

In an embodiment, an image sensor includes: a pixel layer in which an active pixel array and an optical black pixel array are formed; a first anti-reflective layer which is formed over the active pixel array, and including a hafnium oxide layer with a high transmittance; and a second anti-reflective layer which is formed over the optical black pixel array, and including a hafnium oxide layer with a low transmittance, in which the second hafnium oxide layer has transmittance lower than the first hafnium oxide layer.

The hafnium oxide layer which constructs the first anti-reflective layer may be formed with $HfO_2$, and the hafnium oxide layer which constructs the second anti-reflective layer may be formed with $HfOx$ (x is equal to or less than 1).

In another embodiment, an image sensor includes: a pixel layer including an active pixel array and an optical black pixel array; a first anti-reflective layer formed over the active pixel array and including a first hafnium oxide layer; and a second anti-reflective layer formed over the optical black pixel array and including a second hafnium oxide layer, in which the second hafnium oxide layer has an oxide ratio lower than the first hafnium oxide layer.

In an embodiment, a method of fabricating an image sensor includes: providing a substrate in which an active pixel array and an optical black pixel array are formed includes; forming a silicon oxide layer over the active pixel array and the optical black pixel array; removing a portion of the silicon oxide layer which is formed over the optical black pixel array; forming a hafnium layer over the optical black pixel array and the silicon oxide layer; and forming a hafnium oxide layer with a high transmittance over the active pixel array, and forming a hafnium oxide layer with a low transmittance over the optical black pixel array, in which the second hafnium oxide layer has transmittance lower than the first hafnium oxide layer.

The forming of the hafnium oxide layers may include oxidating the hafnium layer; and removing a remaining silicon material.

In another embodiment, a method of fabricating an image sensor including: forming a first oxide layer over the active pixel array and a second oxide layer over the optical black pixel array; forming a hafnium layer over the first oxide layer and the second oxide layer, reacting the hafnium layer with the first and the second oxide layers to form a first hafnium oxide layer in the active pixel array and a second hafnium oxide layer in the optical black pixel array, in which the second oxide layer is thinner than the first oxide layer, and the second hafnium oxide layer has an oxide ratio lower than the first hafnium oxide layer.

According to the embodiments, in a silicon substrate having an active pixel array and an optical black pixel array, a hafnium oxide layer with a high transmittance is formed over an active pixel array region in which the active pixel array is formed, and a hafnium oxide layer with a low transmittance is formed over an optical black pixel array region in which the optical black pixel array is formed, wherein the two oxide layers are formed to have the same structure, through the same fabrication process.

Accordingly, the out diffusion and the field effect of a P pinning layer which is formed on the backside of an image sensor exhibit the same characteristics, and as a result, a black level compensation characteristic is improved, whereby degradation of SNR and DR may be prevented.

Further, due to the fact that a hafnium oxide layer ($HfO_2$) over the active pixel array region and a hafnium oxide layer ($HfOx$ where x is equal to or less than 1) over the optical black pixel array region are formed through the same fabrication process, the time required to perform the process for forming an anti-reflective layer using a hafnium oxide layer over a silicon substrate may be significantly shortened.

DETAILED DESCRIPTION

Hereinafter, an image sensor having an anti-reflective layer and a fabricating method thereof will be described with reference to the accompanying drawings through various examples of embodiments.

Figure 1:
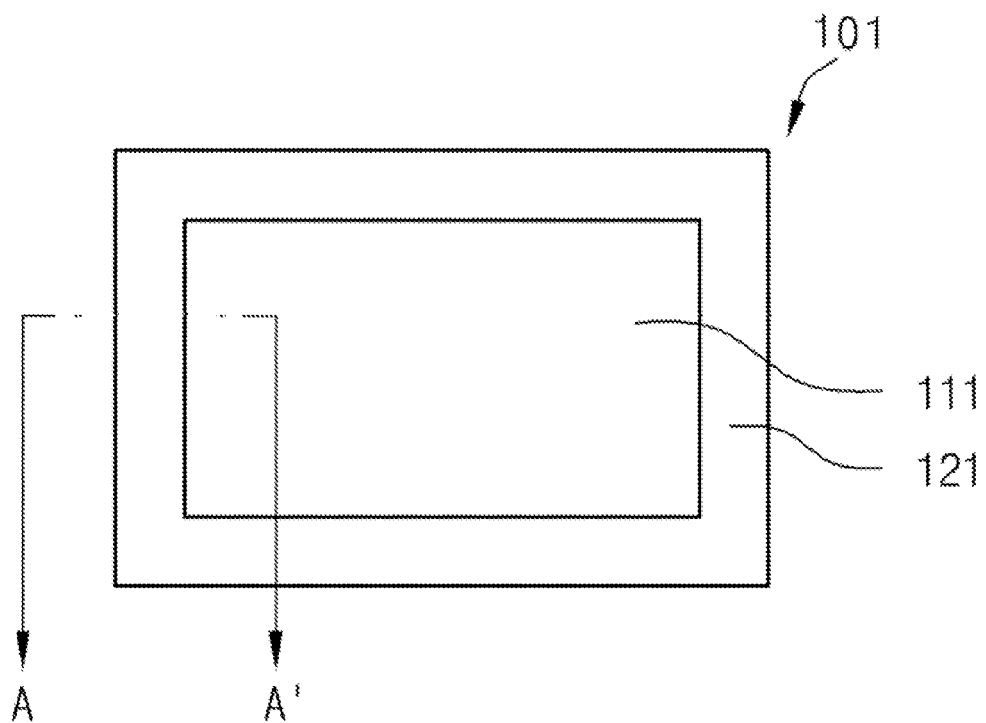
FIG. 1 is a plan view illustrating a pixel array region in an image sensor in accordance with an embodiment.

FIG. 1 is a plan view illustrating a pixel array region 101 which is disposed in an image sensor in accordance with an embodiment. Referring to FIG. 1, the pixel array region 101 is divided into an active pixel array region 111 and an optical black pixel array region 121. The active pixel array region 111 and the optical black pixel array region 121 adjoin each other.

Figure 2:
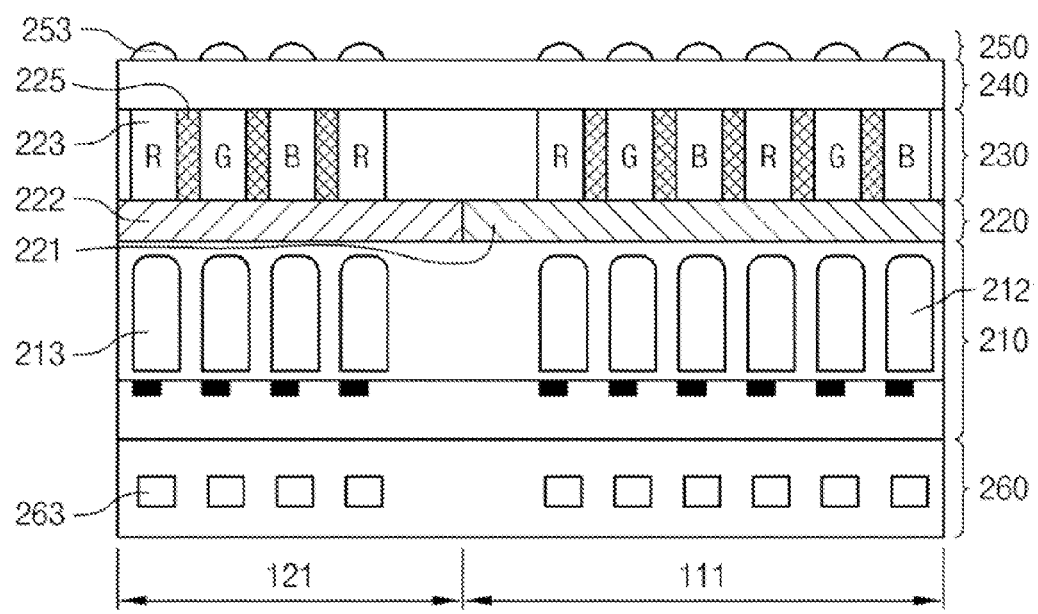
FIG. 2 is a cross-sectional view taken along the line A-A' in the pixel array region shown in FIG. 1 in accordance with an embodiment.
Figure 3:
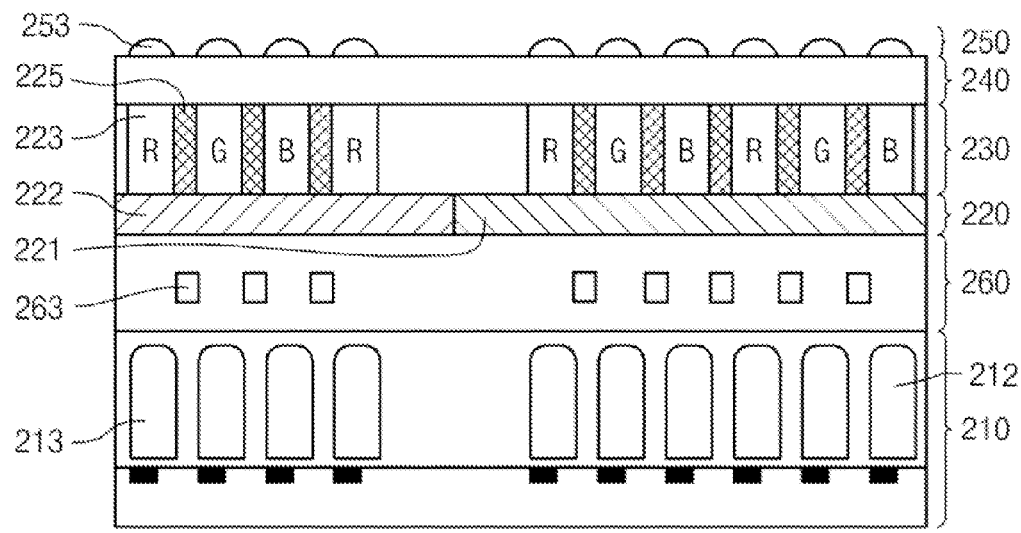
FIG. 3 is a cross-sectional view taken along the line A-A' in the pixel array region shown in FIG. 1 in accordance with another embodiment.

Pixel arrays include a plurality of pixels (see 212 and 213 of FIGS. 2 and 3). For example, a plurality of photo sensing elements is disposed in the active pixel array region 111 and the optical black pixel array region 121. The photo sensing elements may be photo transistors, photodiodes, photogates, pinned photodiodes, and so forth. The plurality of photo sensing elements may be arranged in a matrix.

The active pixel array disposed in the active pixel array region 111 senses light incident from the exterior, converts the sensed light into electric signals, and outputs the electric signals. The electric signals are transferred to an external device (not shown) such as a display which receives digital signals and displays an image. The active pixel array includes a plurality of main photo sensing elements which are arranged in a matrix and functions as main pixels (see 212 of FIGS. 2 and 3).

The optical black pixel array disposed in the optical black pixel array region 121 includes a plurality of dummy pixels (see 213 of FIGS. 2 and 3). The optical black pixel array blocks light incident from the outside and is used to inspect and evaluate the electrical characteristics of the active pixel array, that is, dark noise characteristics caused by dark current. In other words, the optical black pixel array inspects and evaluates the dark noise characteristic by dark current, and adjusts the current value of the main pixels of the active pixel array to compensate for the dark current (see 212 of FIGS. 2 and 3) Thus, the dark noise can be removed from the image sensor. The length and the width of the optical black pixel array may vary and can be determined according to process parameters.

FIG. 2 is a cross-sectional view taken along the line A-A' in the pixel array region 101 shown in FIG. 1. Referring to FIG. 2, the image sensor has a structure in which a micro lens layer 250, a planarization layer 240, a color filter layer 230, an anti-reflective layer 220, a pixel layer 210 and an insulation layer 260 are sequentially formed from the top. This structure is applied to both the active pixel array region 111 and the optical black pixel array region 121.

A plurality of micro lenses 253 are formed in the micro lens layer 250. The plurality of micro lenses 253 condense light incident from the outside and transfer the condensed light to the color filter layer 230. The plurality of micro lenses 253 may be formed such that their ends are brought into contact with one another or such that their ends are separated from one another by a predetermined distance to secure optical shading properties.

The planarization layer 240 guides the light incident through the micro lens layer 250 to enter the color filter layer 230 at a predetermined angle. The planarization layer 240 may include an oxide layer, a nitride layer, or a combined layer thereof.

The color filter layer 230 transmits only visible rays from the light passing through the plurality of micro lenses 253. A plurality of color filters 223 are formed in the color filter layer 230. The plurality of color filters 223 include a plurality of red filters R which transmit only red rays, a plurality of green filters G which transmit only green rays, and a plurality of blue filters B which transmit only blue rays. In another embodiment, the plurality of color filters 223 may include a plurality of cyan filters, a plurality of yellow filters, and a plurality of magenta filters.

The plurality of color filters 223 are formed such that their ends are separated from one another by a predetermined distance. Therefore, an optical crosstalk occurs due to the distance between the plurality of color filters 223. In order to prevent the optical crosstalk, a crosstalk prevention layer 225 is formed between the plurality of color filters 223. In detail, the crosstalk prevention layer 225 is formed between the color filters 223 in such a manner that sidewalls of the crosstalk prevention layer 225 are in contact with or overlap with the color filters 223. For example, the crosstalk prevention layer 225 may be formed along the boundary regions of the pixels 212 and 213 and be arranged in a grid. The crosstalk prevention layer 225 may be formed of the same material as the color filters 223.

The anti-reflective layer 220 is divided into an anti-reflective layer 221 of the active pixel array region 111 and an anti-reflective layer 222 of the optical black pixel array region 121.

The anti-reflective layer 221 of the active pixel array region 111 (also referred to as a first anti-reflective layer 221) transmits light incident through the color filters 223 to the pixel layer 210. The first anti-reflective layer 221 may be formed as a first hafnium oxide ($HfO_2$) layer. The first hafnium oxide layer has high transmittance. Thus, a large amount of light, incident from the outside, can pass through the first anti-reflective layer 221.

Unlike the anti-reflective layer 221 of the active pixel array region 111, the anti-reflective layer 222 of the optical black pixel array region 121 (also referred to as a second anti-reflective layer 222) functions to block light, incident through the color filters 223 from the outside, from being transferred to the pixel layer 210. While blocking the incident light, the pixels 213 of the optical black pixel array region 121 may generate optical black signals. The second anti-reflective layer 222 may include a second hafnium oxide layer $HfO_x$ (x is equal to or less than 1). The second hafnium oxide layer $HfO_x$ (x is equal to or less than 1) has low transmittance. Thus, light incident from the outside does not pass through the second anti-reflective layer 222 and is reflected by the second anti-reflective layer 222.

A plurality of pixels 212 and 213 are formed in the pixel layer 210. The pixel layer 210 may include a single crystalline silicon layer.

Wires 263 including a metallic material are formed in the insulation layer 260. In another embodiment, the wires 263 may not be formed in the insulation layer 260 of the optical black pixel array region 121. The insulation layer 260 may include a silicon oxide layer, a silicon nitride layer, a silicon oxide nitride layer, or a combination thereof. In addition to the wires 263, a plurality of MOSFETs (metal oxide semiconductor field effect transistors), for example, transfer transistors, reset transistors, source follower transistors, selection transistors and bias transistors, may be formed in the insulation layer 260. The MOSFETs are electrically coupled with one another by the wires 263.

A support layer (not shown) may be additionally formed under the insulation layer 260. The support layer supports and protects the insulation layer 260. The support layer prevents the wires 263 formed in the insulation layer 260, from being influenced by external circumstances. The support layer may include a silicon oxide layer, a silicon nitride layer, a silicon oxide nitride layer, or a combination thereof. In another embodiment, the support layer may be formed of single crystalline silicon.

As described above, since the first anti-reflective layer 221 and the second anti-reflective layer 222 are formed as hafnium oxide layers (with different oxygen ratios), they may have the same structure. Even though the first anti-reflective layer 221 and the second anti-reflective layer 222 have the same structure, the first anti-reflective layer 221 has high transmittance characteristics, and the second anti-reflective layer 222 has low transmittance characteristics. Therefore, not only the optical characteristics of the image sensor may be improved, but also the fabrication cost of the image sensor may be reduced.

FIG. 3 is a cross-sectional view taken along the line A-A' in the pixel array region 101 shown in FIG. 1 in accordance with another embodiment. Referring to FIG. 3, the image sensor has a structure in which a micro lens layer 250, a planarization layer 240, a color filter layer 230, an anti-reflective layer 220, an insulation layer 260, and a pixel layer 210 are sequentially formed from the top. A support layer (the same as the support layer described above with reference to FIG. 2) may be additionally formed under the pixel layer 210. This structure is applied to both the active pixel array region 111 and the optical black pixel array region 121.

As shown in FIG. 3, the image sensor may have the insulation layer 260 between the anti-reflective layer 220 and the pixel layer 210. Except for the location of the insulation layer 260, the structure shown in FIG. 3 is the same as the structure in FIG. 2. That is, the micro lens layer 250, the planarization layer 240, the color filter layer 230, the anti-reflective layer 220, the pixel layer 210, and the support layer, are the same in structure as those described in FIG. 2. Thus, repeated descriptions thereof will be omitted.

Wires 263 which are formed of a metallic material are formed in the insulation layer 260. As shown in FIG. 3, the wires 263 are disposed between the color filters 223. That is, the wires 263 may be located under the crosstalk prevention layer 225. As the wires 263 are disposed under the crosstalk prevention layer 225, light which passes through the color filters 223 reach the pixels 213 without interruption or interference by the wires 263.

In another embodiment, the wires 263 may not be disposed in the insulation layer 260 of the optical black pixel array region 121. The insulation layer 260 may include a silicon oxide layer, a silicon nitride layer, a silicon oxide nitride layer, or a combination thereof. In addition to the wires 263, a plurality of MOSFETs (metal oxide semiconductor field effect transistors), for example, transfer transistors, reset transistors, source follower transistors, selection transistors and bias transistors, may be formed in the insulation layer 260. The MOSFETs are electrically coupled with one another by the wires 263.

The structure of the image sensor shown in FIG. 3 may have the same advantages as the image sensor shown in FIG. 2.

FIGS. 4 to 8 are cross-sectional views illustrating a method of fabricating an image sensor in accordance with an embodiment. A method of fabricating the image sensor in accordance with the embodiment will be described below with reference to FIGS. 4 to 8.

Figure 4:
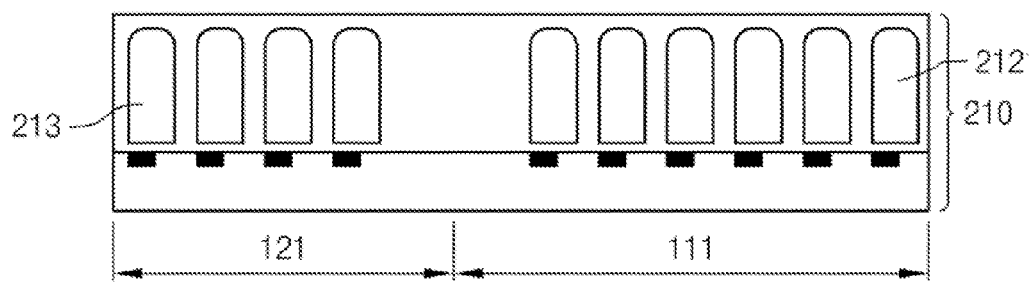
FIGS. 4 to 8 are cross-sectional views illustrating a method of fabricating an image sensor in accordance with an embodiment.

Referring to FIG. 4, a silicon substrate 210 in which a plurality of pixels 212 and 213 are formed is prepared. The silicon substrate 210 corresponds to the pixel layer 210 shown in FIGS. 2 and 3. A support layer (not shown) may be formed under the silicon substrate 210, and an insulation layer (see 260 of FIG. 2) in which wires (see 263 of FIG. 2) are formed may be additionally formed between the silicon substrate 210 and the support layer. Alternatively, an insulation layer (see 260 of FIG. 3) in which wires (see 263 of FIG. 3) are formed may be formed over the silicon substrate 210.

The silicon substrate 210 is divided into an active pixel array region 111 and an optical black pixel array region 121. The active pixel array region 111 and the optical black pixel array region 121 adjoin each other. A plurality of main pixels 212 are formed in the active pixel array region 111, and a plurality of dummy pixels 213 are formed in the optical black pixel array region 121.

Figure 5:
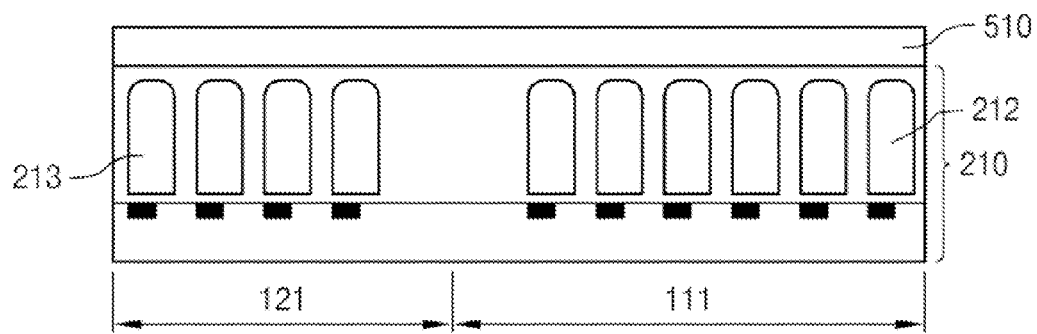

Referring to FIG. 5, a silicon oxide layer 510 is formed on the silicon substrate 210, that is, on the active pixel array region 111 and the optical black pixel array region 121. In order to deposit the silicon oxide layer 510 on the silicon substrate 210, chemical vapor deposition, for example, inductively coupled chemical vapor deposition, may be used. In the inductively coupled chemical vapor deposition, vapor decomposition may occur even at low temperatures by generating high-density plasma. Since a region where plasma generates is separated from the silicon substrate 210 by using remote plasma, an ion-damage to a layer-growth region by plasma may be reduced. In order to deposit the silicon oxide layer 510, SIH4, N2O and a diluted He gas may be used as reaction gases.

Figure 6:
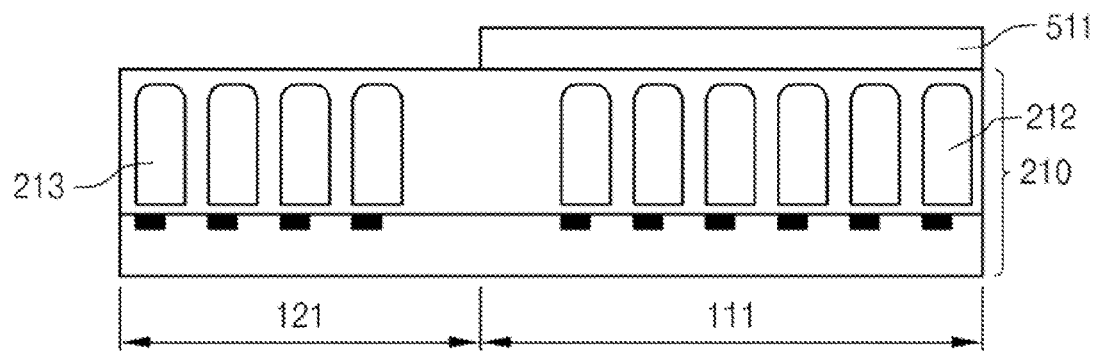

Referring to FIG. 6, a portion of the silicon oxide layer 510 of FIG. 5 which is formed on the optical black pixel array region 121 is removed. In order to remove the portion of the silicon oxide layer 510 which is formed on the optical black pixel array region 121, first, a photoresist layer (not shown) is formed on the silicon oxide layer 510, and the portion of the photoresist layer which is formed on the optical black pixel array region 121 is removed through an exposure and development process to form a photoresist pattern on the active pixel array region 111. Then, the portion of the silicon oxide layer 510 which is formed on the optical black pixel array region 121 is removed using the photoresist pattern formed on the active pixel array region 111 as a mask. Finally, the photoresist pattern remaining on the active pixel array region 111 is removed to form a silicon oxide pattern 511.

Figure 7:
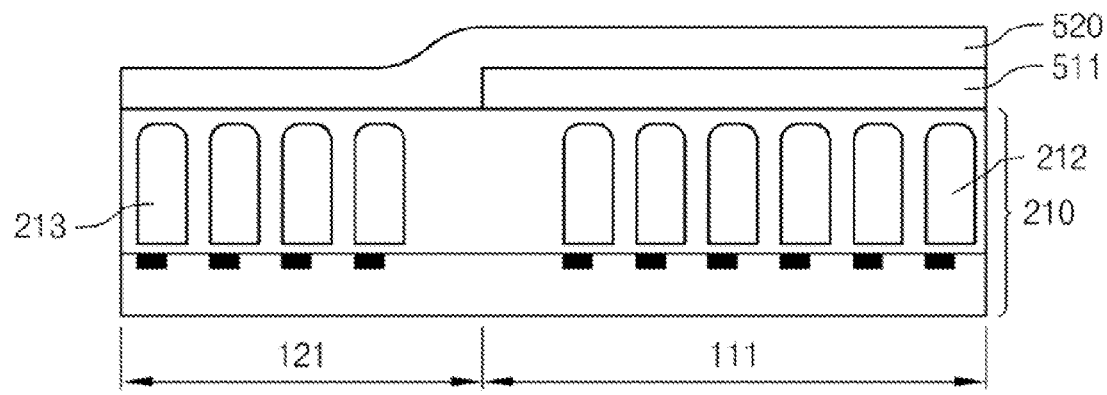

Referring to FIG. 7, a hafnium layer 520 is formed on the optical black pixel array region 121 and on the silicon oxide pattern 511. In other words, the hafnium layer 520 is formed on the optical black pixel array region 121 and over the active pixel array region 111. In order to form the hafnium layer 520 on the silicon substrate 210, the silicon substrate 210 is placed in a sputtering chamber (not shown), and a hafnium material is deposited on the silicon substrate 210 through sputtering.

In detail, while the silicon substrate 210 is placed in the sputtering chamber, the sputtering chamber is kept in a vacuum state, and a sputter gas such as argon (Ar) is introduced into the sputtering chamber. Then, particles of the sputter gas are ionized into a plasma state, and the ionized particles are smashed against a target including hafnium. Hafnium atoms are emitted from the target. The emitted hafnium atoms diffuse into the silicon substrate 210 and are deposited on the silicon substrate 210. As a result, the hafnium layer 520 is formed on the silicon substrate 210. The ionization probability of particles increases due to a magnetic field formed between the N pole and the S pole of a magnet which is positioned on the backside of the target.

As a sputtering method, for example, a reactive DC sputtering method using a plasma emission monitor may be used.

Figure 8:
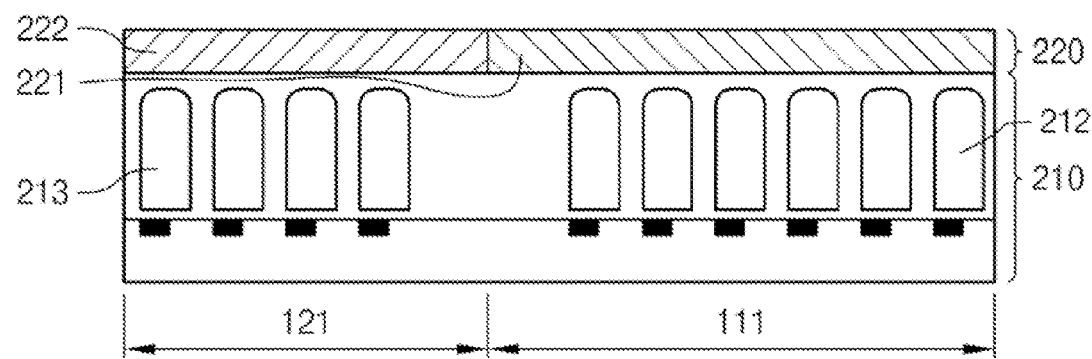

Referring to FIG. 8, a first hafnium oxide layer (HfO2) 221 with high transmittance is formed on the active pixel array region 111, and a second hafnium oxide layer (HfOx where x is equal to or less than 1) 222 with low transmittance is formed on the optical black pixel array region 121. The hafnium oxide layers 221 and 222 may be dielectric material. Then, a planarization process may be performed against the first hafnium oxide layer (HfO2) 221 and the second hafnium oxide layer so upper surfaces of the first hafnium oxide layer (HfO2) 221 and the second hafnium oxide layer are flush with each other.

Figure 9:
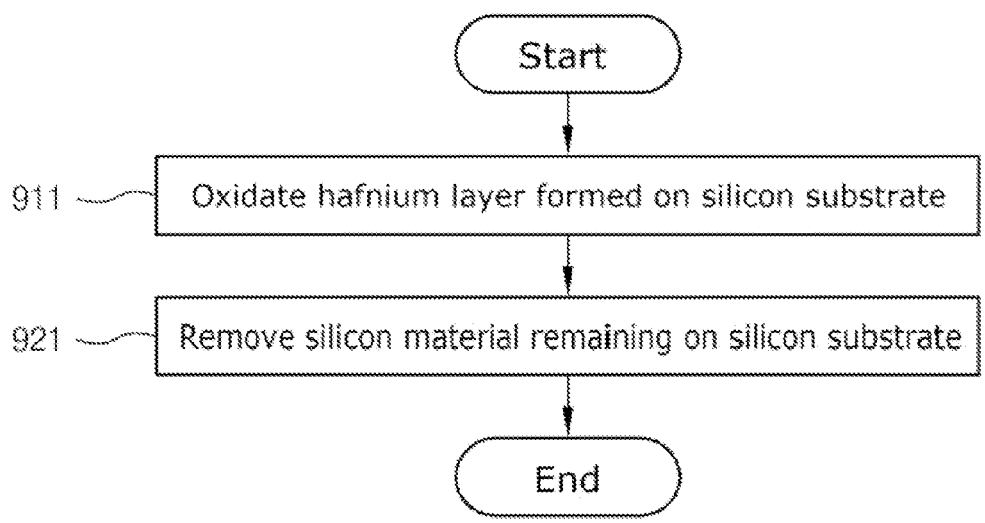
FIG. 9 is a flow chart to assist in explaining the process shown in FIG. 8.

FIG. 9 is a flow chart to illustrate in more detail the structure shown in FIG. 8. Referring to FIG. 9, in order to form the first and the second hafnium oxide layers (with different oxygen ratios) 221 and 222 on the silicon substrate 210, the first step 911 and the second step 921 are included. The flow chart shown in FIG. 9 will be described below with reference to FIGS. 7 and 8.

In the first step 911, the hafnium layer 520 formed on the silicon substrate 210 is oxidized.

As a first method of forming the first and the second hafnium oxide layers 221 and 222, the silicon substrate 210 including the hafnium layer 520 is placed at a room temperature for a predetermined time. Then, the following chemical reactions take place between the hafnium layer 520 and the silicon oxide pattern 511 to form the first hafnium oxide layer 221.

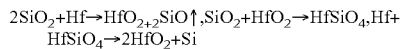

On the active pixel array region 111, a thermodynamic reaction takes place between the previously formed silicon oxide pattern 511 and the hafnium layer 520, and thus, the hafnium oxide layer (HfO$_2$) 221 is produced.

However, on the optical black pixel array region 121, since the silicon oxide layer 510 is removed and only an extremely small amount of silicon (Si) or a silicon oxide layer (SiO2) exists, a thermodynamic reaction takes place between the hafnium layer 520 and the extremely small amount of silicon, and thus, the second hafnium oxide layer (HfOx where x is equal to or less than 1) 222 is produced. Because the second hafnium oxide layer (HfOx where x is equal to or less than 1) 222 has low transmittance, light incident from outside does not pass through the second hafnium oxide layer (HfOx where x is equal to or less than 1) 222 and is reflected.

Figure 10:
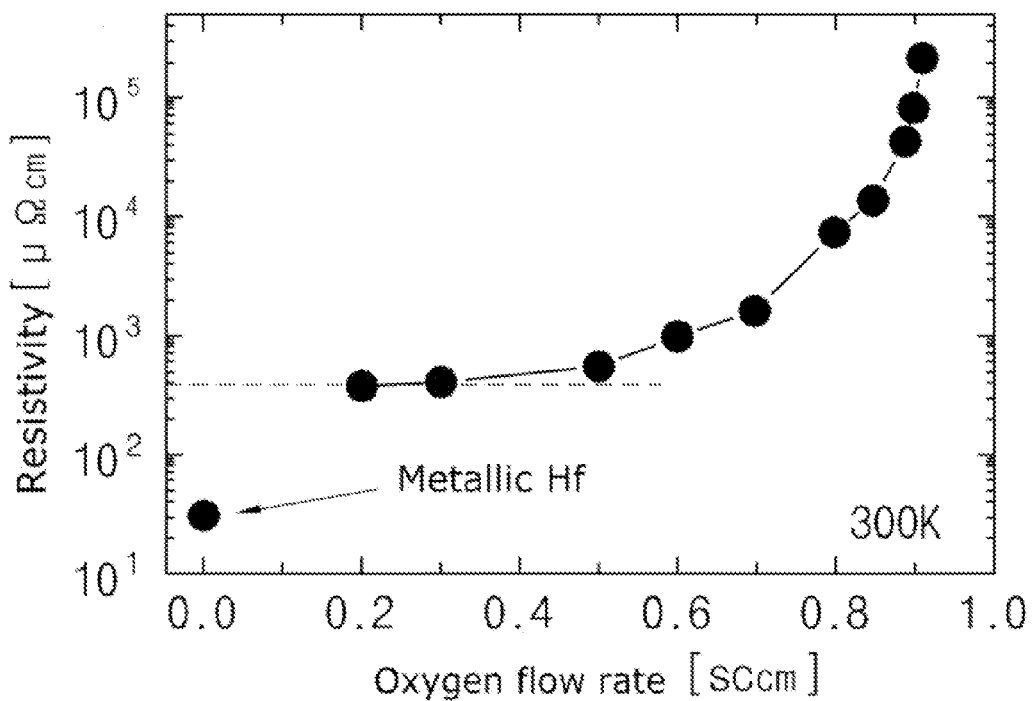
FIG. 10 is a graph illustrating the relationship between oxygen flow rate and resistivity in a hafnium oxide layer.

Referring to FIG. 10, as oxygen flow rate is low, resistance is reduced and approaches the resistance of metallic Hf. As the resistance reduces, transmittance decreases.

According to an embodiment, the second hafnium oxide layer (HfOx where x is equal to or less than 1) 222 with a low oxygen ratio is formed on the optical black pixel array region 121. Since the second hafnium oxide layer has low optical transmittance, light incident from the outside does not pass through the second anti-reflective layer (see 222 of FIGS. 2 and 3) of the optical black pixel array region 121 and is not transferred to the optical black pixel array which is formed in the optical black pixel array region 121.

Another method for forming the first and the second hafnium oxide layers 221 and 222 is as follows. The silicon substrate 210 including the hafnium layer 520 is annealed for 30 to 150 minutes at a predetermined temperature, for example, at 300 to 450° C. Then, the hafnium oxide layers 221 and 222 are produced by the above-described thermodynamic reactions.

In the second step 921, the silicon material remaining on the silicon substrate 210 is removed. In order to remove the silicon material, a method of immersing the silicon substrate 210 in a silicon etching solution for a predetermined time, a method of cleaning the silicon substrate 210 by using a specified chemical to remove the silicon material remaining on the silicon substrate 210, and so forth may be used.

According to the embodiment, the first hafnium oxide layer (HfO$_2$) 221 with high transmittance, which is formed on the active pixel array region 111 of the silicon substrate 210, and the second hafnium oxide layer (HfOx where x is equal to or less than 1) 222 with low transmittance, which is formed on the optical black pixel array region 121 of the silicon substrate 210, may be formed through the same fabrication process.

As a result, the time required to form the anti-reflective layer 220, which includes the first and the second hafnium oxide layers 221 and 222, on the silicon substrate 210 may be significantly shortened.

As a consequence, the fabrication cost image sensors may be reduced, the failure rate may decrease, and reliability of image sensors may be improved.

What is claimed is:

1. An image sensor comprising:
   a pixel layer including an active pixel array and an optical black pixel array;
   a first anti-reflective layer formed over the active pixel array and including a first hafnium oxide layer; and
   a second anti-reflective layer formed over the optical black pixel array and including a second hafnium oxide layer, wherein the second hafnium oxide layer has transmittance lower than the first hafnium oxide layer.

2. The image sensor according to claim 1, wherein the first hafnium oxide layer includes HfO$_2$.

3. The image sensor according to claim 1, wherein the second hafnium oxide layer includes HfOx (x is equal to or less than 1).

4. The image sensor according to claim 1, wherein the first anti-reflective layer and the second anti-reflective layer adjoin each other.

5. The image sensor according to claim 1, further comprising:
   an insulation layer formed under the pixel layer,
   wires formed in the insulation layer,
   a color filter layer, suitable to transmit light, formed over the first and second anti-reflective layers, and
   a micro lens layer, suitable to condense light, formed over the color filter layer.

6. The image sensor according to claim 1, further comprising:
   an insulation layer formed between the pixel layer and the first and second anti-reflective layers,
   wires formed in the insulation layer, a color filter layer, suitable to transmit light, formed over the first and second anti-reflective layers, and is a micro lens layer, suitable to condense light, formed over the color filter layer.

7. A method of fabricating an image sensor comprising:
providing a substrate in which an active pixel array and an optical black pixel array are formed;
forming a silicon oxide layer over the active pixel array and the optical black pixel array;
removing a portion of the silicon oxide layer which is formed over the optical black pixel array;
forming a hafnium layer over the optical black pixel array and the silicon oxide layer; and
forming a first hafnium oxide layer over the active pixel array, and forming a second hafnium oxide layer over the optical black pixel array,
wherein the second hafnium oxide layer has transmittance lower than the first hafnium oxide layer.

8. The method according to claim 7, wherein the forming of the first and the second hafnium oxide layers comprises:
oxidizing the hafnium layer; and
removing a remaining silicon material.

9. The method according to claim 7, wherein the first and the second hafnium oxide layers are formed by annealing the hafnium layer at 300 to 450° C.

10. The method according to claim 7, wherein the first and the second hafnium oxide layers are formed by placing the hafnium layer at a room temperature for 30 to 150 minutes.

11. An image sensor comprising:
a pixel layer including an active pixel array and an optical black pixel array;
a first anti-reflective layer formed over the active pixel array and including a first hafnium oxide layer; and
a second anti-reflective layer formed over the optical black pixel array and including a second hafnium oxide layer,
wherein the second hafnium oxide layer has an oxide ratio lower than the first hafnium oxide layer.

12. The image sensor of claim 11,
wherein the second hafnium oxide layer has transmittance lower than the first hafnium oxide layer.

13. A method of fabricating an image sensor comprising:
forming a first oxide layer over the active pixel array and a second oxide layer over the optical black pixel array;
forming a hafnium layer over the first oxide layer and the second oxide layer; and
reacting the hafnium layer with the first and the second oxide layers to form a first hafnium oxide layer in the active pixel array and a second hafnium oxide layer in the optical black pixel array,
wherein the second oxide layer is thinner than the first oxide layer, and
wherein the second hafnium oxide layer has an oxide ratio lower than the first hafnium oxide layer.

14. The method of claim 13,
wherein each of the first and the second oxide layers includes silicon oxide, silicon oxide nitride, or a combination thereof.

15. The method of claim 13, further comprising:
removing the second oxide layer.

* * * * *